(12) United States Patent
Sankman et al.

(10) Patent No.: US 11,127,727 B2
(45) Date of Patent: Sep. 21, 2021

(54) THERMAL SPREADING MANAGEMENT OF 3D STACKED INTEGRATED CIRCUITS

(71) Applicant: Intel Corporation, Santa Clara, CA (US)

(72) Inventors: Robert L. Sankman, Phoenix, AZ (US); Pooya Tadayon, Hillsboro, OR (US); Weihua Tang, Chandler, AZ (US); Chandra M. Jha, Chandler, AZ (US); Zhimin Wan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/433,756

(22) Filed: Jun. 6, 2019

(65) Prior Publication Data

US 2020/0388603 A1    Dec. 10, 2020

(51) Int. Cl.
| | |
|---|---|
| *H01L 25/18* | (2006.01) |
| *H01L 23/48* | (2006.01) |
| *H01L 23/42* | (2006.01) |
| *H01L 23/00* | (2006.01) |

(52) U.S. Cl.
CPC .............. *H01L 25/18* (2013.01); *H01L 23/42* (2013.01); *H01L 23/481* (2013.01); *H01L 24/42* (2013.01); *H01L 2924/1431* (2013.01); *H01L 2924/1436* (2013.01)

(58) Field of Classification Search
CPC ....... H01L 25/18; H01L 23/42; H01L 23/481; H01L 24/42
See application file for complete search history.

(56) References Cited

U.S. PATENT DOCUMENTS

| | | | |
|---|---|---|---|
| 2013/0026652 A1* | 1/2013 | Fujii | ................... H01L 25/0657 257/774 |
| 2019/0259718 A1* | 8/2019 | Choi | ................... H01L 23/3171 |
| 2019/0259743 A1* | 8/2019 | Han | ......................... H01L 24/30 |
| 2019/0393124 A1* | 12/2019 | Wuu | ..................... H01L 23/367 |
| 2020/0013767 A1* | 1/2020 | Baik | ................... H01L 23/5386 |

* cited by examiner

*Primary Examiner* — Matthew E. Gordon
(74) *Attorney, Agent, or Firm* — Schwegman Lundberg & Woessner, P.A.

(57) ABSTRACT

An electronic device and associated methods are disclosed. In one example, the electronic device includes a plurality of dies, a logic die coupled to the plurality of dies, and a dummy die thereon. In selected examples, the dummy die is located between the logic die and the plurality of silicon dies. In selected examples, the dummy die is attached to the logic die.

18 Claims, 4 Drawing Sheets

THERMAL SPREADING MANAGEMENT OF 3D STACKED INTEGRATED CIRCUITS

TECHNICAL FIELD

Embodiments described herein generally semiconductor devices and systems.

BACKGROUND

Semiconductor devices can contain three dimensional (3D) stacks of integrated circuits (IC) dies connected to a singles logic die. In such stacks, heat dissipation can be uneven throughout the dies. It is desired to have more uniform heat distribution that address these concerns, and other technical challenges.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DESCRIPTION OF EMBODIMENTS

Figure 1:
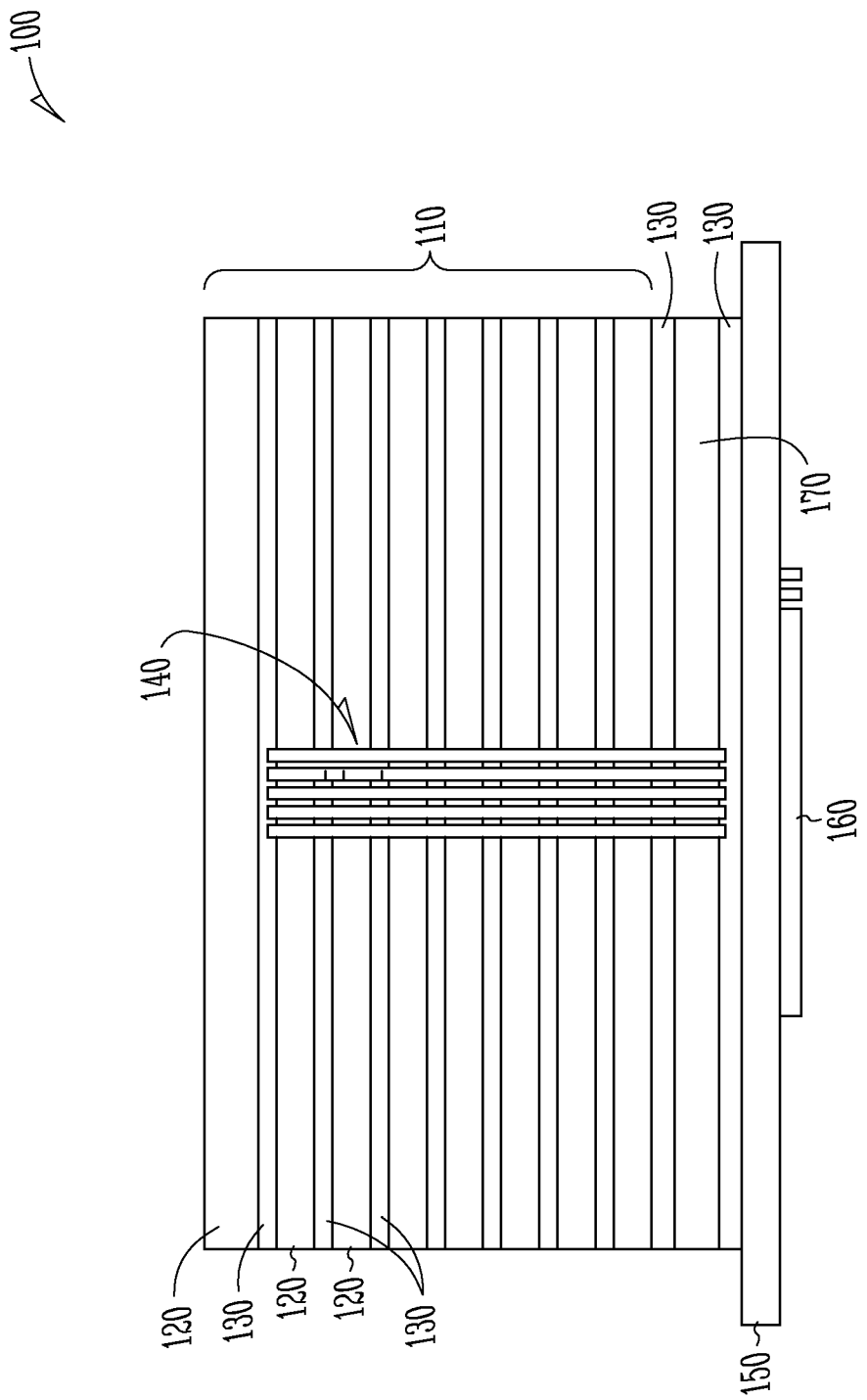
FIG. 1 illustrates a schematic view of a semiconductor device including a 3D stacked IC with a dummy die in various embodiments.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

In the figures and the text that follows, the terms "top" and "bottom" are used to show orientations of particular features on particular elements, or relative orientations of one element to another element. The designations of top and bottom are used merely for convenience and clarity and are not intended to represent absolute orientation or direction. For example, a "top" surface of an element remains a top surface regardless of an absolute orientation of the element, even if the element is inverted during storage or use. This document uses the common convention of a chip package being positioned on top of a motherboard, which establishes directions of up and down, and top and bottom, relative to this convention.

Three dimensional (3D) stacked integrated circuit (IC) dies present unique challenges to thermal management. The resistance of the stacked dies can be high due to inter-die dielectric layers. Non-uniform dispersion of heat throughout the stacked dies can cause hot spots and cold spots through the stacked dies.

In conventional 3D stacked ICs, a portion of the power source could be on a small region on the bottom of the logic die or other bottom die. The logic die and inter-die dielectric layer can, in turn, have a thickness and resistance that prevent even spreading of heat from the power source to the rest of the device, creating inefficient dissipation of power (heat) that results in hot spots or cold spots. For this reason, a conventional device can be subject to uneven heating and become the limiter of power in a larger package into which it is incorporated.

This can result in limited package performance overall. Specifically, inefficient heat dissipation can cause certain portions of a conventional device to heat at a faster rate, reaching a threshold junction temperature (Tj) faster. The threshold junction temperature is the highest temperature at which a semiconductor (or other electronic device) can operate at. Once threshold junction temperature is reached, clock frequency and other performance metrics are reduced.

Previous attempts at regulating thermal dissipation in 3D stacked ICs have included, for example, reduction of total package power through reducing central processing unit (CPU) or graphic processing unit (GPU) power, reduced workload and frequency of using stacked ICs, the use of liquid cooling fluid, use of high conductivity thermal interface layers (e.g., (solder or other TIM), or increased refresh rate (e.g., for HBM) to enable a higher threshold junction temperature (Tj).

Each of these approaches has certain disadvantages. Reducing power or workload of the 3D stacked ICs decreases total package performance. This is not sustainable with increasing thermal designation power (TDP) demands. Liquid cooling or solder solutions increase package cost, size, and decrease lifetime reliability. Increasing HBM refresh rates increases overall power consumption, resulting in more burdens for the cooling system.

Discussed herein is the use of a dummy die, made of a thermally conductive material, such as boron nitride, diamond, boron arsenide, silicon or silicon carbide, between a bottom die (i.e., a logic die) and a substrate, or between the bottom die (i.e., a logic die) and the stack of dies. The use of a dummy die can, for example, promote uniform dispersion of heat through stacked dies in a 3D stacked IC device.

The use of a dummy die can help spread (or dissipate) heat throughout a 3D stacked IC. In some embodiments, the heat can be dissipated when it reaches air; in other embodiments, the heat is spread more evenly throughout the 3D stacked IC. FIG. 1 illustrates a schematic view of a semiconductor device including a 3D stacked IC 100 with a dummy die 170 in various embodiments. Device 100 includes die stack 110 with individual dies 120 and interface layers 130, interconnect 140, logic die 150, power source 160, and dummy die 170. Device 100 can run at a total stack power from about 0.0 W to about 100.0 W (e.g., about 15.0 W to about 20.0 W, or about 16.0 W to about 18.0 W). In device 100, power source 160 is electrically coupled to logic die 150, which is electrically coupled via interconnect 140 to die stack 110. Die stack 110 includes individual dies 120 separated by interface layers 130, and electrically connected through interconnect 140. Dummy die 170 is attached between die stack 110 and bottom die 150.

Device 100 can be a 3D stacked IC. 3D stacked ICs can, for example, include a 3D integration scheme that relies on interconnect at the package level, such as wire bonding or flip chip to achieve vertical stacks. Examples of 3D packages can include package-on-package (PoP) where individual die are packaged, and the packages are stacked and interconnected with wire bonds or flip chip processes, or, for example, 3D wafer-level packaging that uses redistribution layers and bumping processes to form interconnects.

3D stacked ICs, such as device 100 can, for example, contain dies which are stacked together and connected with through silicon vias (TSVs, e.g., holes created in a silicon wafer using an etch process used as interconnects), or alternatively can use fabrication processes to stack multiple device layers on a single die, that can sometimes use TSVs. In some embodiments, device 100 can be monolithic 3D stacked ICs where a base wafer is, for example, added onto with additional layers of crystallized silicon, metalized layers, and active or passive circuitry. In monolithic 3D stacked ICs, interconnects may be formed, for example, between layers rather than dies.

In device 100, an example 3D IC, die stack 110 can, for example, be a memory die stack including volatile memory such as a dynamic random-access memory (DRAM). If die stack 110 is a DRAM die stack, it can be, for example, a type of random access semiconductor memory that stores each bit of data in a separate capacitor within an IC (i.e., one of dies 140). Each capacitor within the DRAM die can, for example, be charged or discharged, representing two or more values of a bit, such as a 0 or a 1. A DRAM die, such as dies 120, can prevent loss of electric charge (and loss of data) by connection to an external memory refresh circuit.

Alternatively, die stack 110 can include other types of memory, such as a synchronous dynamic random access memory (SDRAM), RAMBUS dynamic random access memory (RDRAM), or other type of random access memory device. In other embodiments, die stack 110 can include non-volatile memory, such as, for example, flash memory, phase change memory (PCM), read-only memory (ROM), electrically erasable programmable read-only memory (EE-PROM), or any other type of non-volatile memory device.

Alternatively, die stack 110 can include a static RAM (SRAM) or other memory dies for use with a multi-core processor die; or die stack 110 could include a a system of chip (SOC). Other appropriate 3D stacked ICs could be used for die stack 110 as known to one in the art.

In FIG. 1, eight individual dies 120 are schematically represented. In other embodiments, more or less dies 120 can be present. Each of the adjacent individual dies 120 can be separated by interface layers 130. Interface layers 130 can include, for example, solder, thermal bumps, electrical bumps, a metallic interface, an epoxy-based material, an underfill, combinations thereof, or other materials as appropriate in the art. The interface layers 130 can serve to spatially and electrically separate individual dies 120 within die stack 110. The interface material 130 can, for example, serve as an adhesive, dielectric layer, or a laminate. Interconnect 140 can, for example, pass through the interface layers 130.

Interconnect 140 can electrically couple individual dies 120 to each other and to logic die 150 (discussed below). Interconnect 140 can be, for example, a vertical interconnect made of an electrically conductive material. In some embodiments, interconnect 140 can include one or more through silicon vias (TSVs) running through the individual dies 120. In other embodiments, one or more wire bonds can be used along with, or in place of interconnect 140, implemented using a die stack or stair step configuration, or other interconnects appropriate in the art.

Logic die 150 can be connected to die stack 110 through interconnect 140. Logic die can be, for example, a logic die for HBM or other appropriate logic die for a 3D stacked IC device 100. Thickness of logic die 150, which can be in the range of about 50 micrometers, can hinder heat dissipation from power source 160 to the rest of device 100. In some embodiments, logic die 150 is another type of die located on the bottom of the die stack. In alternative embodiments, logic die 150 can be a multi-core processor die (i.e., on which an alternative memory die stack 110 would sit), or a voltage regulator (i.e., on which a memory plus processor or other SOC die stack 110 would sit).

Power source 160 provides power to device 100. Power source 160 can be connected to logic die 150 opposite die stack 110. In some embodiments, power source 160 is integrated with logic die 150. Power source 160 can be electrically coupled to logic die 150 through direct connection, wire bonds, or other appropriate means. Power source 160 can provide, for example, power of about 0.00 W to about 100.0 W (e.g., 6.0 W to about 9.0 W or about 7.0 W to about 8.0 W).

In device 100, dummy die 170 is inserted into device 100 between logic die 150 and die stack 110. Dummy die 170 can be made of silicon, silicon carbide, or other appropriate thermally conductive material with optional passive circuitry, such as, for example, boron nitride, diamond, or boron arsenide. Overall area and thickness of dummy die 170 can vary depending on power from power source 160, size and material of logic die 150, and overall heat dispersion needs. For example, dummy die 170 can have larger footprint than DRAM die if desired for heat dissipation. In some embodiments, the dummy die 170 can have a thickness of about 50 µm to about 300 µm (e.g., about 100 µm to about 200 µm), depending on the specifics of device 100. The length and width of the dummy die can range from about 2 mm to about 30 mm (e.g., about 5 mm to about 20 mm).

Generally, dummy die 170 can be, for example, a die similar to individual dies 120. Dummy die 170 can be shaped and processed, for example, like individual dies 120. For this reason, processing of dummy die 170 need not be separate or expensive compared to the processing of 3D stacked IC 100 as a whole.

However, dummy die 170 has minimal or no electrical circuitry, such that it is not "active" in the die stack 110, and is not in electric communication with individual dies 120. In general, dummy die 170 has minimal electrical components. In some instances, dummy die 170 can have minimal circuitry to allow for pass through of, for example, through silicon vias or other interconnets. However, dummy die 170 is in thermal communication with logic die 150, power source 160, and die stack 110.

In device 100, the dummy die 170 can be located between the logic die and the plurality of silicon dies for lateral thermal spreading. The dummy die can have, for example, a thermal conductivity of about 120 W/mK to about 400 W/mK at room temperature (e.g., about 150 W/mK to about 350 W/mK).

The dummy die 170 can be attached to both the logic die 150 and the die stacks 110 via solder. For example, solder thermal interface material (sTIM) or other highly thermally conductive materials can be used to bond dummy die 170 to logic die 150 and die stack 110 to allow for thermal spreading.

Inserting a dummy die 170 between logic die 150 and die stack 110 allows for spread of heat through device 100. This is due in part to the high thermal conductivity of silicon (or silicon carbide) that dummy die 160 is made of Spreading of heat throughout device 100 can minimize formation of hot spots that is common in conventional 3D stacked ICs. Moreover, the use of dummy die 170 can reduce the maximum temperature on logic die 150 and/or memory die stack 110.

Figure 2:
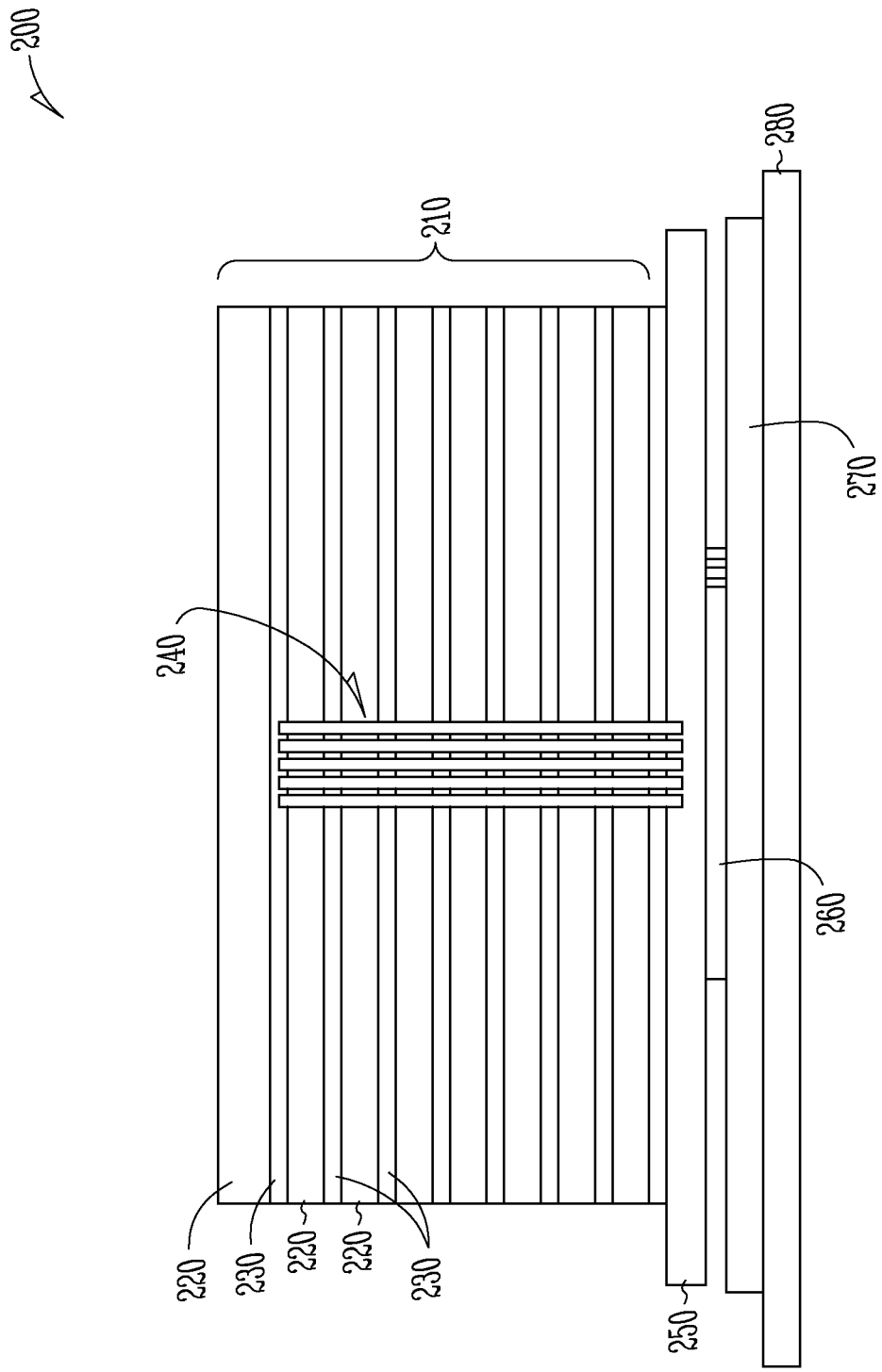
FIG. 2 illustrates a schematic view of a semiconductor device including a 3D stacked IC with a dummy die in various embodiments.

In an alternative embodiment, FIG. 2 illustrates a schematic view of a semiconductor device including a 3D stacked IC 200 with a die stack 210 with individual dies 220 and interface layers 230, interconnect 240, logic die 250, power source 260, dummy die 270, and substrate 280. Device 200 can run at a total stack power from about 0.00 W to about 100.0 W (e.g., about 15.0 W to about 19.0 W or about 16.0 W to about 18.0 W).

In device 200, power source 260 is electrically coupled to logic die 250, which is electrically coupled via interconnect 240 to die stack 210. Die stack 210 includes individual dies 220 separated by interface layers 230, and electrically connected via interconnect 240. Logic die 4040250 is sitting on substrate 280, with dummy die 270 therebetween. Die stack 210 with individual dies 220, interface layers 230, interconnect 240, logic die 250, and power source 260 are similar to the corresponding components as discussed with reference to FIG. 1.

Dummy die 270 in device 200 can be made of, for example, silicon, silicon carbide, or other appropriate thermally conductive material with optional passive circuitry, such as, for example, boron nitride, diamond, or boron arsenide. Overall size and thickness of dummy die 270 can vary depending on power from power source 260, size and material of logic die 250, and overall heat dispersion needs. The dummy die can have, for example, a thermal conductivity of about 120 W/mK to about 400 W/mK at room temperature.

In device 200, the dummy die 270 can be located between the logic die and substrate 180 for lateral thermal spreading. Substrate 280 can be, for example, a substrate for hosting device 200. The dummy die 270 can be attached to both the logic die 250 and the substrate 280 via solder. For example, solder thermal interface material (sTIM) or other highly thermally conductive materials can be used to bond dummy die 270 to logic die 250 and substrate 280 to allow for thermal spreading.

Inserting a dummy die 270 between logic die 250 and substrate 280 allows for spreading of heat through device 200. This is due in part to the high thermal conductivity of silicon (or silicon carbide) that dummy die 260 is made of. Spreading of heat throughout device 200 can minimize formation of hot spots that is common in conventional 3D stacked ICs HBM DRAM embodiments of devices with dummy dies showed constant silicon dummy dies had a thermal conductivity of 120 W/mK, while silicon carbide dummy dies had a thermal conductivity of 300 W/mK at room temperature. At increased temperatures, the thermal conductivity of both silicon and silicon carbide increased, giving additional thermal management benefits.

Using thermal imaging, hot spots were observed in HBM DRAM device samples without dummy dies, and particularly appeared at a high temperature gradients with hot spots appearing in small regions. In contrast, with the added dummy die of silicon carbide, the heat was spread out from the hot spot.

During testing of embodiments of HBM DRAM device samples with dummy dies, a reduced threshold junction temperature (threshold Tj, e.g., a highest operating temperature of a semiconductor) was observed compared to prior art devices without a dummy die. HBM DRAM devices with a silicon dummy die showed an average Tj of 4-5° C. lower compared to devices without dummy dies. HBM DRAM devices with a silicon carbide dummy die showed an average Tj of 8-10° C. lower compared to devices without dummy dies.

The devices with the dummy die placed between the HBM logic die and the DRAM die stack showed an average Tj of 4-8° C. lower compared to devices without dummy dies. The devices with the dummy die placed between the HBM logic die and a substrate showed an average Tj of 5-10° C. lower compared to devices without dummy dies.

Overall, devices with a dummy die, such as the embodiments shown as devices 100 and 200, can have a reduced junction temperature while maintaining total package power, increasing overall performance. During side by side testing, up to ten degrees Celsius reduction was achieved while maintaining package power. Alternatively, the power of the device package can be comparatively higher while maintaining the original junction temperature.

Figure 3:
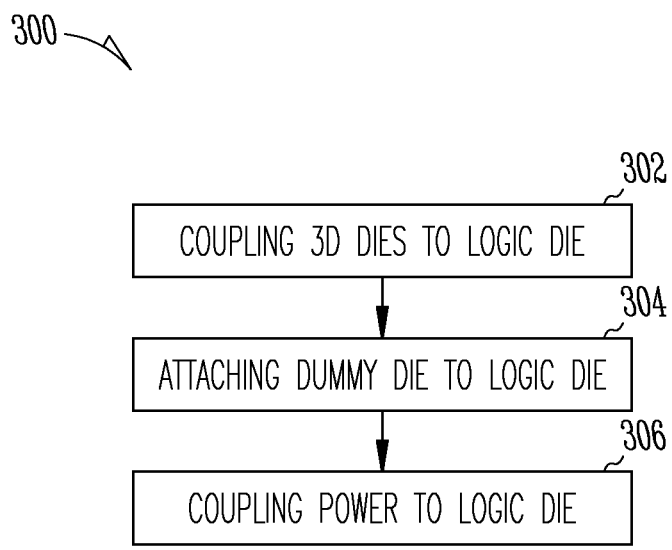
FIG. 3 illustrates a method for manufacturing the semiconductor device.

FIG. 3 illustrates a method 300 for manufacturing the semiconductor device. Optionally, all dies (i.e., logic die, die stack, dummy die), can be configured to include active or passive circuitry and/or cut as needed prior to stacking.

The die stack can then be prepared by alignment and stacking of individual dies as needed to begin creating the 3D stack. For example, the dies can be joined by interface layers such as solder, thermal bumps, epoxy-based materials, or other materials as known in the art.

Then, in step 310, the 3D stacked die stack can be electrically coupled to the logic die. This can be done, for example, with wire bonding, stair stepping, through silicon vias, vertical interconnects, or other interconnects as appropriate in the art.

Next, in step 320 the dummy die can be attached to the logic die. For example, this can be done by applying solder TIM or other thermally conductive attachment material to the dummy die and the logic die so as to thermally couple the two dies. Finally, in step 330, a power source can be electrically coupled to the logic die by methods such as wire bonding or other electrically conductive methods. In some embodiments, the power source is part of the circuitry on and integrated with the logic die.

FIG. 5 illustrates a system level diagram, depicting an example of an electronic device (e.g., system) that may include the device and/or methods described above. In one embodiment, system 400 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 600 includes a system on a chip (SOC) system.

In one embodiment, processor 410 has one or more processor cores 412 and 412N, where 412N represents the Nth processor core inside processor 410 where N is a positive integer. In one embodiment, system 400 includes multiple processors including 410 and 505, where processor 505 has logic similar or identical to the logic of processor 410. In some embodiments, processing core 412 includes, but is not limited to, pre-fetch logic to fetch instructions, decode logic to decode the instructions, execution logic to execute instructions and the like. In some embodiments, processor 410 has a cache memory 416 to cache instructions and/or data for system 400. Cache memory 416 may be organized into a hierarchal structure including one or more levels of cache memory.

In some embodiments, processor 410 includes a memory controller 414, which is operable to perform functions that enable the processor 410 to access and communicate with memory 430 that includes a volatile memory 432 and/or a non-volatile memory 434. In some embodiments, processor 410 is coupled with memory 430 and chipset 420, such as the 3D stacked ICs 100, 200, or other chipsets including a dummy die described herein. Processor 410 may also be coupled to a wireless antenna 478 to communicate with any device configured to transmit and/or receive wireless signals. In one embodiment, an interface for wireless antenna 478 operates in accordance with, but is not limited to, the IEEE 802.11 standard and its related family, Home Plug AV (HPAV), Ultra-Wide Band (UWB), Bluetooth, WiMAX, or any form of wireless communication protocol.

In some embodiments, volatile memory 432 includes, but is not limited to, Synchronous Dynamic Random-Access Memory (SDRAM), Dynamic Random-Access Memory (DRAM), RAMBUS Dynamic Random-Access Memory (RDRAM), and/or any other type of random-access memory device. Non-volatile memory 434 includes, but is not limited to, flash memory, phase change memory (PCM), read-only memory (ROM), electrically erasable programmable read-only memory (EEPROM), or any other type of non-volatile memory device.

Memory 430 stores information and instructions to be executed by processor 410. In one embodiment, memory 430 may also store temporary variables or other intermediate information while processor 410 is executing instructions. In the illustrated embodiment, chipset 420 connects with processor 410 via Point-to-Point (PtP or P-P) interface layers 517 and 422. Chipset 420 enables processor 410 to connect to other elements in system 400. In some embodiments of the example system, interface layers 517 and 422 operate in accordance with a PtP communication protocol such as the Intel® Quick Path Interconnect (QPI) or the like. In other embodiments, a different interconnect may be used.

In some embodiments, chipset 420 is operable to communicate with processor 410, 505N, display device 440, and other devices, including a bus bridge 572, a smart TV 476, I/O devices 574, nonvolatile memory 460, a storage medium (such as one or more mass storage devices) 462, a keyboard/mouse 464, a network interface 466, and various forms of consumer electronics 477 (such as a PDA, smart phone, tablet etc.), etc. In one embodiment, chipset 420 couples with these devices through an interface 424. Chipset 420 may also be coupled to a wireless antenna 478 to communicate with any device configured to transmit and/or receive wireless signals. In one example, any combination of components in a chipset may be separated by a continuous flexible shield as described in the present disclosure.

Chipset 420 connects to display device 440 via interface 426. Display 440 may be, for example, a liquid crystal display (LCD), a light emitting diode (LED) array, an organic light emitting diode (OLED) array, or any other form of visual display device. In some embodiments of the example system, processor 410 and chipset 420 are merged into a single SOC. In addition, chipset 420 connects to one or more buses 450 and 455 that interconnect various system elements, such as I/O devices 574, nonvolatile memory 460, storage medium 462, a keyboard/mouse 464, and network interface 466. Buses 450 and 455 may be interconnected together via a bus bridge 572.

In one embodiment, mass storage device 462 includes, but is not limited to, a solid state drive, a hard disk drive, a universal serial bus flash memory drive, or any other form of computer data storage medium. In one embodiment, network interface 466 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra-Wide Band (UWB), Bluetooth, WiMAX, or any form of wireless communication protocol.

Figure 4:
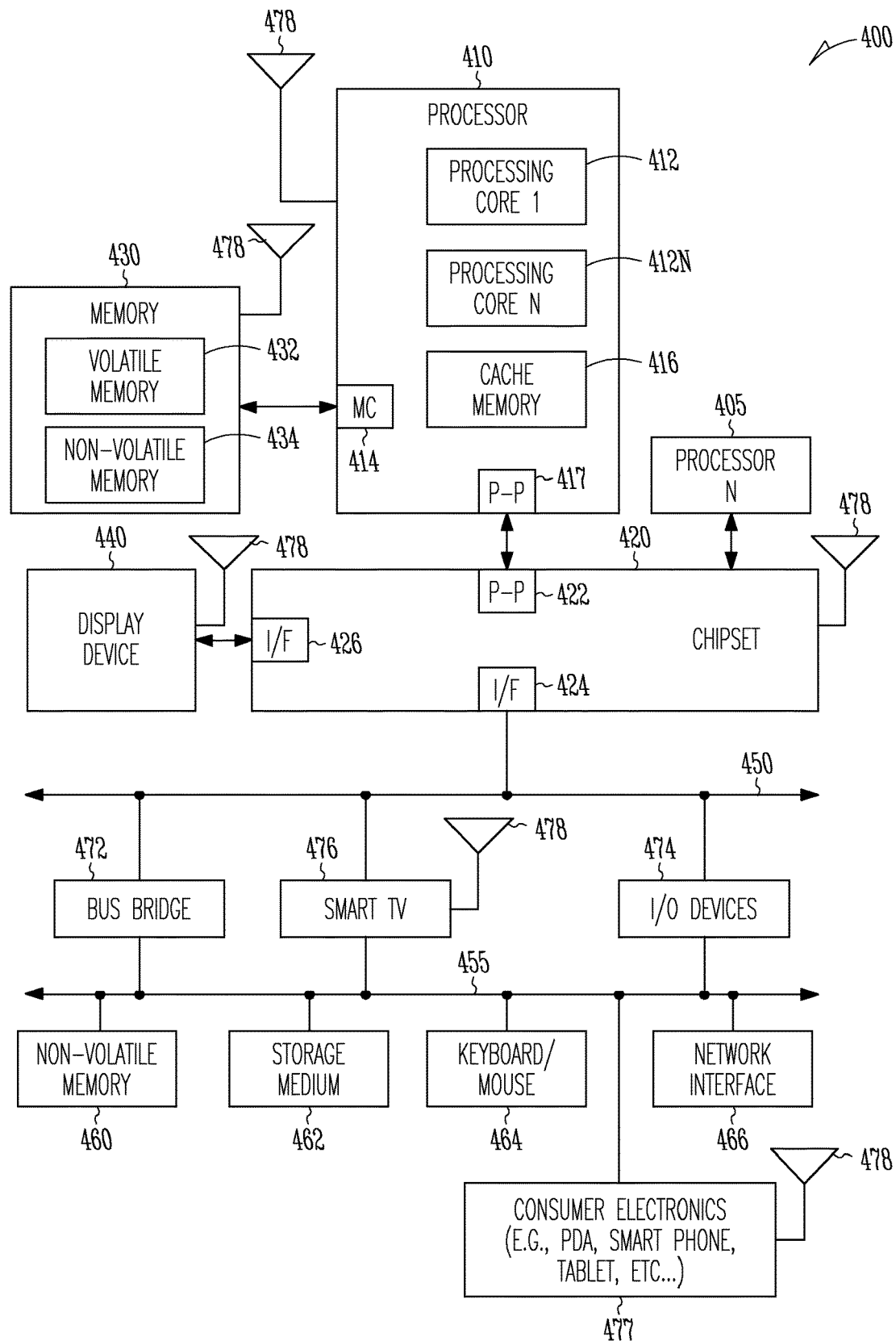
FIG. 4 illustrates a system level diagram, depicting an example of an electronic system including the semiconductor device as described in the present disclosure.

While the modules shown in FIG. 4 are depicted as separate blocks within the system 400, the functions performed by some of these blocks may be integrated within a single semiconductor circuit or may be implemented using two or more separate integrated circuits. For example, although cache memory 416 is depicted as a separate block within processor 410, cache memory 416 (or selected aspects of 416) can be incorporated into processor core 412.

EXAMPLES

To better illustrate the method and apparatuses disclosed herein, a non-limiting list of embodiments is provided here:

Example 1 includes a plurality of dies, a logic die coupled to the plurality of dies, and a dummy die thereon.

Example 2 includes the semiconductor device of example 1, wherein the plurality of dies are attached to each other through a plurality of interface layers.

Example 3 includes the semiconductor device of examples 1-2, wherein the plurality of dies comprise a die stack.

Example 4 includes the semiconductor device of examples 1-3, wherein the plurality of dies are coupled to the logic die by one or more wire bonds.

Example 5 includes the semiconductor device of examples 1-4, wherein plurality of dies are coupled to the logic die by one or more through silicon vias.

Example 6 includes the semiconductor device of examples 1-5, wherein the logic die is a high bandwidth memory die.

Example 7 includes the semiconductor device of examples 1-6, wherein the dummy die comprises silicon, silicon carbide, boron nitride, diamond, boron arsenide, or combinations thereof.

Example 8 includes the semiconductor device of examples 1-7, wherein the dummy die is attached to the logic die by solder, thermal bumps, electrical bumps, a metallic interface, an epoxy-based material, an underfill, or combinations thereof.

Example 9 includes the semiconductor device of examples 1-8, wherein the dummy die is located between the logic die and the plurality of dies.

Example 10 includes the semiconductor device of examples 1-9, wherein the dummy die is attached to the plurality of dies by solder, thermal bumps, electrical humps, a metallic interface, an epoxy-based material, an underfill, or combinations thereof.

Example 11 includes the semiconductor device of examples 1-10, wherein the dummy die has a thermal conductivity of about 120 W/mK to about 400 W/mK at room temperature.

Example 12 includes the semiconductor device of examples 1-11, further comprising a power source coupled to the logic die.

Example 13 includes the semiconductor device of examples 1-12, wherein the power source provides power of about 6.0 W to about 9.0 W.

Example 14 includes the semiconductor device of examples 1-13, wherein the power source provides power of about 7.0 W to about 8.0 W.

Example 15 includes the semiconductor device of examples 1-14, wherein the semiconductor device has a power of from about 15.0 W to about 19.0 W.

Example 16 includes the semiconductor device of examples 1-15, wherein the semiconductor device has a power of from about 16.0 W to about 18.0 W.

Example 17 includes a semiconductor device including a die stack comprising a plurality of dies, a logic die coupled to the die stack by an interconnect, a power source coupled to the logic die and configured to produce heat, and a dummy die attached to the logic die, the dummy die configured to spread the heat produced by the power source.

Example 18 includes the device of Example 17, wherein the dummy die comprises one or more through silicon vias and no other electrical components.

Example 19 includes a system comprising a motherboard, a display device electrically connected to the motherboard, an antenna electrically connected to the motherboard, and a semiconductor device coupled to the motherboard including a plurality of dies, a logic die coupled to the plurality of dies, and a dummy die thereon.

Example 20 includes a method of manufacturing a semiconductor device comprising coupling a three-dimensional stacked integrated circuit to a logic die, attaching a dummy die to the logic die, and coupling a power source to the logic die.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The foregoing description, for the purpose of explanation, has been described with reference to specific example embodiments. However, the illustrative discussions above are not intended to be exhaustive or to limit the possible example embodiments to the precise forms disclosed. Many modifications and variations are possible in view of the above teachings. The example embodiments were chosen and described in order to best explain the principles involved and their practical applications, to thereby enable others skilled in the art to best utilize the various example embodiments with various modifications as are suited to the particular use contemplated.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

The terminology used in the description of the example embodiments herein is for the purpose of describing particular example embodiments only and is not intended to be limiting. As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

The invention claimed is:

1. A semiconductor device comprising:
 a plurality of dies, wherein the plurality of dies comprise a stack of integrated circuit dies;
 a logic die coupled to the plurality of dies, wherein the logic die is a high bandwidth memory die, and the logic die is aligned with the stack of integrated circuit dies;
 a dummy die thereon, wherein the dummy die is located between the logic die and the plurality of dies, the dummy die extending along a majority of a footprint of the plurality of dies and aligned with the stack of integrated circuit dies; and at least one solder thermal interface layer in physical contact with and between the dummy die and one or more of the logic die and the plurality of dies, wherein the at least one solder thermal interface layer is aligned with both the dummy die and the plurality of dies wherein the dummy die and the at least one solder thermal interface layer are configured to dissipate heat from the plurality of dies.

2. The semiconductor device of claim 1, wherein the plurality of dies are attached to each other through a plurality of interface layers.

3. The semiconductor device of claim 1, wherein the plurality of dies comprise a memory stack.

4. The semiconductor device of claim 1, wherein the plurality of dies are coupled to the logic die by one or more through silicon vias.

5. The semiconductor device of claim 1, wherein the dummy die comprises silicon, silicon carbide, boron nitride, diamond, boron arsenide, or combinations thereof.

6. The semiconductor device of claim 1, wherein the dummy die is attached to the logic die by solder, thermal bumps, electrical bumps, a metallic interface, an epoxy-based material, or combinations thereof.

7. The semiconductor device of claim 1, wherein the dummy die has a thermal conductivity of about 120 W/mK to about 400 W/mK at room temperature.

8. The semiconductor device of claim 1, further comprising a power source coupled to the logic die.

9. The semiconductor device of claim 8, wherein the power source provides power of about 6.0 W to about 9.0 W.

10. The semiconductor device of claim 9, wherein the power source provides power of about 7.0 W to about 8.0 W.

11. The semiconductor device of claim 1, wherein the semiconductor device has a power of from about 15.0 W to about 19.0 W.

12. The semiconductor device of claim 11, wherein the semiconductor device has a power of from about 16.0 W to about 18.0 W.

13. The semiconductor device of claim 1, wherein the dummy die comprises one or more through silicon vias and no other electrical components.

14. The semiconductor device of claim 1, wherein the logic die is coupled to the stack of integrated circuit dies by an interconnect.

15. The semiconductor device of claim 14, further comprising a power source coupled to the logic die, wherein the dummy die is configured to spread heat produced by the power source, when in operation.

16. A system comprising:
a motherboard;
a display device electrically connected to the motherboard;
an antenna electrically connected to the motherboard; and
a semiconductor device coupled to the motherboard comprising:
a plurality of dies comprising a stack of integrated circuit dies;
a logic die coupled to the plurality of dies, wherein the logic die is a high bandwidth memory die, and the logic die is aligned with the stack of integrated circuit dies;
a dummy die thereon, wherein the dummy die is located between the logic die and the plurality of dies in a footprint of the plurality of dies and aligned with the stack of into rated circuit dies; and
at least one solder thermal interface layer in physical contact with and between the dummy die and one or more of the logic die and the plurality of dies, wherein the at least one solder thermal interface layer is aligned with both the dummy die and the plurality of dies
wherein the dummy die and the at least one solder thermal interface layer are configured to dissipate heat from the plurality of dies.

17. The system of claim 16, wherein the display device further comprises a touchscreen.

18. The system of claim 16, wherein the logic die is a multi-core processor.

\* \* \* \* \*

UNITED STATES PATENT AND TRADEMARK OFFICE
CERTIFICATE OF CORRECTION

PATENT NO. : 11,127,727 B2  
APPLICATION NO. : 16/433756  
DATED : September 21, 2021  
INVENTOR(S) : Sankman et al.

It is certified that error appears in the above-identified patent and that said Letters Patent is hereby corrected as shown below:

In the Claims

In Column 12, Line 27, in Claim 16, delete "into rated" and insert --integrated-- therefor Signed and Sealed this  
Sixteenth Day of November, 2021

Drew Hirshfeld  
*Performing the Functions and Duties of the*  
*Under Secretary of Commerce for Intellectual Property and*  
*Director of the United States Patent and Trademark Office*